United States Patent
Kim

(10) Patent No.: US 7,416,990 B2
(45) Date of Patent: Aug. 26, 2008

(54) METHOD FOR PATTERNING LOW DIELECTRIC LAYER OF SEMICONDUCTOR DEVICE

(75) Inventor: Jung Bae Kim, Gwangmyeong (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,678

(22) Filed: Dec. 30, 2005

(65) Prior Publication Data

US 2007/0138137 A1    Jun. 21, 2007

(30) Foreign Application Priority Data

Dec. 20, 2005    (KR) .................. 10-2005-0126250

(51) Int. Cl.
*H01L 21/302* (2006.01)
(52) U.S. Cl. ............... 438/708; 438/706; 438/709; 216/66
(58) Field of Classification Search ........... 438/706, 438/708, 709, 710, 712, 714; 216/66
See application file for complete search history.

(56) References Cited

U.S. PATENT DOCUMENTS

| | | | | |
|---|---|---|---|---|
| 5,230,985 | A * | 7/1993 | Lohaus et al. ............ 430/280.1 |
| 6,756,085 | B2 * | 6/2004 | Waldfried et al. ........... 427/515 |
| 6,903,027 | B2 * | 6/2005 | Matsuura ................. 438/725 |
| 7,091,137 | B2 * | 8/2006 | Lee et al. ................. 438/778 |
| 7,253,125 | B1 * | 8/2007 | Bandyopadhyay et al. .. 438/795 |
| 7,262,142 | B2 * | 8/2007 | Nakata et al. ............. 438/795 |
| 2004/0029386 | A1 * | 2/2004 | Lee et al. ................. 438/689 |

FOREIGN PATENT DOCUMENTS

KR    1999-62415    7/1999

* cited by examiner

*Primary Examiner*—Lan Vinh
(74) *Attorney, Agent, or Firm*—McKenna Long & Aldridge LLP

(57) ABSTRACT

A method for patterning a low dielectric insulating layer of a semiconductor device improves adhesion between a photoresist and the low dielectric (Low-K) insulating layer by removing at least one hydroxyl group from a surface of the Low-K insulating layer with a beam. Reliability of the device is thereby improved. The method includes forming a Low-K insulating layer on a semiconductor substrate, irradiating the Low-K insulating layer with a beam to make the Low-K insulating layer hydrophobic, forming a photoresist pattern on the Low-K insulating layer, and ashing the photoresist pattern.

9 Claims, 5 Drawing Sheets

METHOD FOR PATTERNING LOW DIELECTRIC LAYER OF SEMICONDUCTOR DEVICE

This claims the benefit of Korean Patent Application No. 10-2005-0126250, filed on Dec. 20, 2005, which is hereby incorporated by reference for all purposes as if fully set forth herein.

BACKGROUND OF THE INVENTION

1. Field of the Invention

The present invention relates to a method for forming a semiconductor device. More particularly, the present invention relates to a method for patterning a low dielectric layer of a semiconductor device. The method enables better adhesion between a photoresist and a low dielectric (Low-K) insulating layer by removing a hydroxyl group from a surface of the Low-K insulating layer with a beam. Reliability of the device is thereby improved.

2. Discussion of the Related Art

A plurality of devices numbering above $1 \times 10^9$ may be integrated into one fingernail-sized semiconductor chip. Furthermore, the number of devices integrated into one semiconductor chip increases by geometrical progression.

To obtain high-integration and high-speed in a device, it is necessary to develop the structure and material of a semiconductor chip. Thus, an insulating layer of the semiconductor chip may be formed of a low dielectric material, for example, a Low-K insulating layer.

To manufacture a semiconductor device on a semiconductor wafer of a silicon material, it is necessary to provide various processes for manufacturing the semiconductor device. For example, the processes may include a layer formation process, an ion implantation process, photolithography, etc.

Photolithography uses a photoresist, having a property that changes due to a chemical reaction induced by exposure to light. Photolithography may include steps of depositing a film on a substrate, coating a photoresist on the film, selectively exposing the photoresist by UV (ultra-violet) irradiation, developing the exposed photoresist, etching the film using the developed photoresist as a mask, and stripping the photoresist. It is very important to maintain good adhesion between the film formed on the semiconductor wafer and the coated photoresist.

When an insulating layer is formed of a Low-K insulating material, it is even more important to maintain good adhesion between the Low-K insulating layer and the photoresist. However, adhesion between the Low-K insulating layer and the photoresist may deteriorate due to a hydroxyl group formed in the surface of the Low-K insulating layer.

As shown in FIGS. 1A and 1B, the Low-K insulating layer includes a hydroxyl group provided in the form of a silanol group (Si—OH) and a water molecule having a hydrogen bond, wherein the hydroxyl group has a hydrophilic property. The photoresist has a hydrophobic property. As a result, the adhesion between the photoresist and the Low-K insulating layer is poor.

To remove the silanol group (Si—OH) from the surface of the Low-K insulating layer, a thermal treatment of about 1000° C. is conducted for several hours. However, the temperature of about 1000° C. is too high for the process of manufacturing electronic devices.

Accordingly, a dehydroxylation method for solving the problem caused by the hygroscopic property of the Low-K insulating layer has been researched and studied. Typically, a thermal treatment of about 400° C. may be applied to the Low-K insulating layer under a gas atmosphere including an $H_2$ molecule. In another method, the Low-K insulating layer may be made to be hydrophobic by reacting a silicon organic compound, such as HMDS (HexaMethylDiSilazane), with the hydroxyl group.

If the photoresist is coated after applying the dehydroxylation method to the Low-K insulating layer, the adhesion between the Low-K insulating layer and the photoresist may be improved. Accordingly, as the photoresist is uniformly coated, it is possible to improve the efficiency of an exposure process.

A method for patterning a low dielectric (Low-K) insulating layer of a semiconductor device according to the related art will be described with reference to the accompanying drawings.

First, as shown in FIG. 1A, a low dielectric (Low-K) insulating layer 12 is formed on a semiconductor substrate 11. Then, an HMDS process is applied to the Low-K insulating layer 12 so as to improve the adhesion property by removing at least one —OH group from the Low-K insulating layer 12. Next, a bake process is applied to the semiconductor substrate 11 so as to remove moisture or organic solvent from the semiconductor substrate 11.

Referring to FIG. 1B, as $H_2O$ is removed, the hydrophilic —OH group is changed into a hydrophobic —O(H$_3$C)$_3$Si group. As a result, the surface of the Low-K insulating layer 12 has a hydrophobic property.

Then, a photoresist is coated on a surface of the semiconductor substrate, 11 including the Low-K insulating layer 12. Then, a bake process is applied to the coated photoresist to remove solvent from the photoresist. Thereafter, an exposure and development process is performed to form a photoresist pattern.

Subsequently, after performing a hard-bake process for the semiconductor substrate having the photoresist pattern, the exposed Low-K insulating layer is selectively etched using the photoresist pattern as a mask.

Then, after stripping the photoresist pattern of the semiconductor substrate from the Low-K insulating layer, a cleaning process is performed, thereby patterning the Low-K insulating layer.

However, the method for patterning the Low-K insulating layer of the semiconductor device according to the related art has the following disadvantages.

When changing the hydrophilic property of the Low-K insulating layer to a hydrophobic property, to improve the adhesion between the Low-K insulating layer and the photoresist, the HMDS process uses an excessive amount of solution. Also, processing time increases due to the HMDS coating and bake processes.

The treatment, which may include using a $H_2/N_2$ gas, is performed for the semiconductor substrate at a temperature of about 400° C. Accordingly, the reliability of device is lowered due to the extra thermal budget.

SUMMARY OF THE INVENTION

Accordingly, the present invention is directed to a method for patterning a low dielectric insulating layer of a semiconductor device that substantially obviates one or more problems due to limitations and disadvantages of the related art.

An advantage of the present invention is to provide a method for patterning a low dielectric insulating layer of a semiconductor device to improve adhesion between a photoresist and the low dielectric (Low-K) insulating layer by removing at least one hydroxyl group from a surface of the Low-K insulating layer with a beam, thereby improving the reliability of device.

Additional features and advantages of the invention will be set forth in the description which follows, and will be apparent from the description, or may be learned by practice of the invention. The objectives and other advantages of the invention may be realized and attained by the structure and method particularly pointed out in the written description and claims hereof as well as the appended drawings.

To achieve these and other advantages and in accordance with the purpose of the invention, as embodied and broadly described, a method for patterning a low dielectric (Low-K) insulating layer of a semiconductor device includes forming a Low-K insulating layer on a semiconductor substrate, irradiating the Low-K insulating layer with a beam to make the Low-K insulating layer hydrophobic, forming a photoresist pattern on the Low-K insulating layer, and ashing the photoresist pattern.

UV rays may irradiate the Low-K insulating layer, whereby at least one —OH group, which causes a hydrophilic property, is removed from the surface of the Low-K insulating layer. As a result, the surface of the Low-K insulating layer becomes hydrophobic. That is, it is possible to solve the problem of the related art by removing the hygroscopic property of the Low-K insulating layer.

Also, the adhesion between the photoresist and the Low-K insulating layer is improved by removing at least one —OH group from the Low-K insulating layer. Accordingly, it is possible to prevent the photoresist from lifting off and to perform uniform exposure, thereby improving the reliability of device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

A method for patterning a low dielectric (Low-K) insulating layer of a semiconductor device according to the present invention will be described with reference to the accompanying drawings.

FIGS. 2A to 2E illustrate cross sectional views of a low dielectric (Low-K) insulating layer fabricated by a patterning process of a semiconductor device according to an exemplary embodiment of the present invention. FIGS. 3A to 3C illustrate a reaction mechanism of a low dielectric (Low-K) insulating layer patterning process of a semiconductor device according to an exemplary embodiment of the present invention.

Figure 1A:
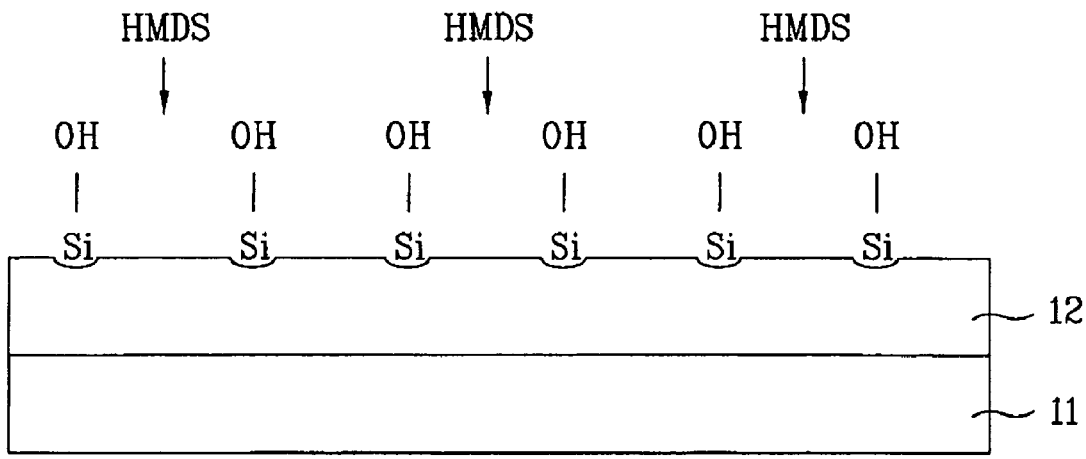
FIGS. 1A and 1B illustrate cross sectional views of a low dielectric (Low-K) insulating layer fabricated by a patterning process of a semiconductor device according to the related art.
Figure 1B:
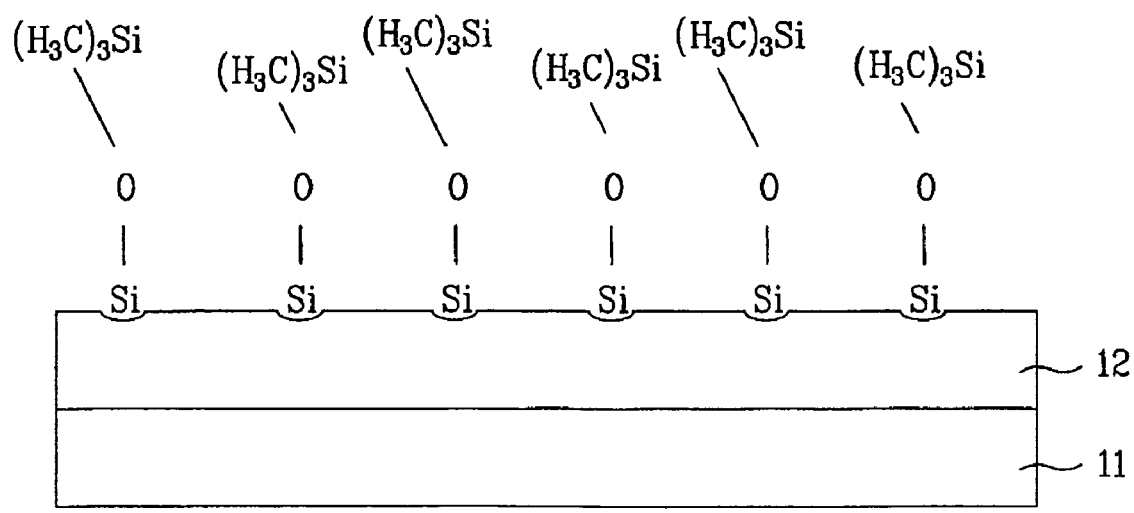
Figure 2A:
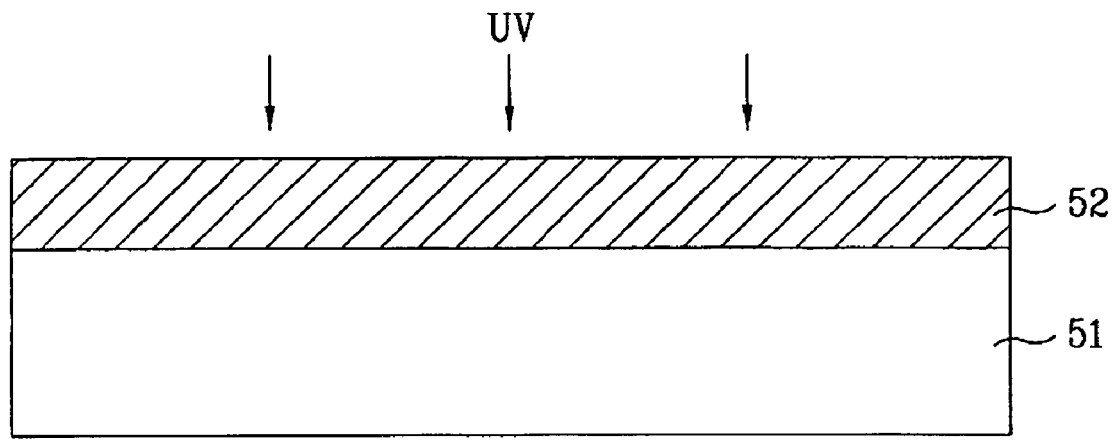
FIGS. 2A to 2E illustrate cross sectional views of a low dielectric (Low-K) insulating layer fabricated by a patterning process of a semiconductor device according to an exemplary embodiment of the present invention.
Figure 3A:
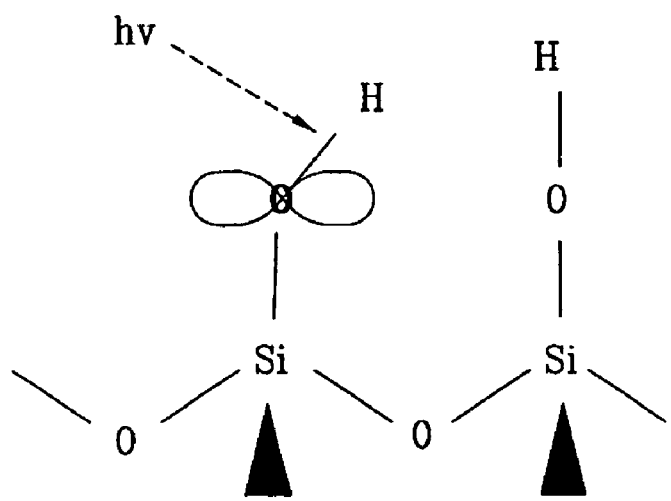
FIGS. 3A to 3C illustrate a reaction mechanism of a low dielectric (Low-K) insulating layer patterning process of a semiconductor device according to an exemplary embodiment of the present invention.
Figure 3B:
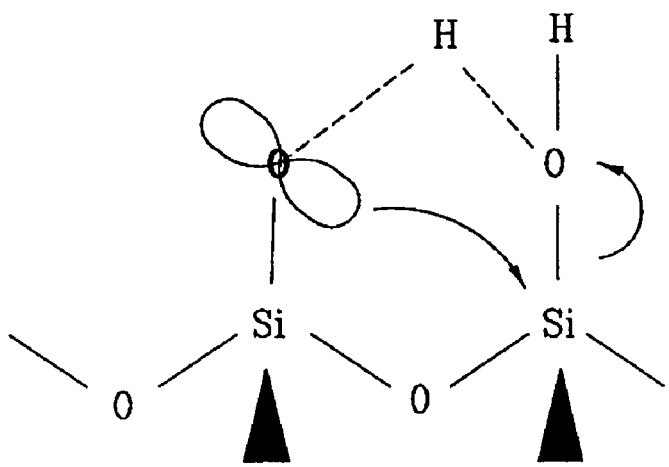
Figure 3C:
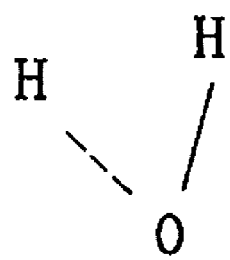
Figure 3C:
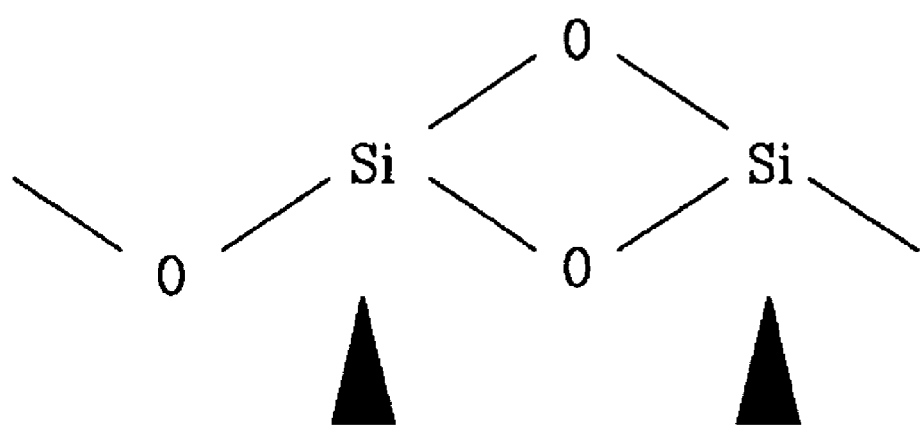

As shown in FIG. 2A, a low dielectric (Low-K) insulating layer 52 is formed on a semiconductor substrate 51 having a predetermined pattern. The semiconductor substrate 51 may include a material layer, such as a conductive layer, as well as a silicon wafer substrate. The conductive layer may be formed of a layer doped with impurity ions, a copper line layer, or another conductive pattern.

The Low-K insulating layer 52 is formed of a low dielectric material, for example, a phosphorous silicate glass PSG layer, a boron phosphorous silicate glass BPSG layer, an undoped silicate glass USG layer, a fluorine doped silicate glass FSG layer, an SIOC layer, a high density plasma HDP layer, a plasma enhanced-tetra ethyl ortho silicate PE-TEOS layer, or a spin on glass SOG layer. Also, the Low-K insulating layer 52 is formed at a thickness between about 1500 Å and 15000 Å, and may be formed at a thickness between 3000 Å and 5000 Å.

Then a beam irradiates the Low-K insulating layer 52, whereby at least one hydroxyl group (—OH) is removed from the surface of the Low-K insulating layer 52. The beam has an energy which corresponds to the dissociation energy of an O—H bond. The beam may have an energy of above 4.43 eV. For example, excimer laser or UV beam may selectively irradiate the Low-K insulating layer 52.

If a KrF excimer laser is used, the irradiation amount may be in a range of about 20 mJ/cm$^2$ to 70 mJ/cm$^2$. The Low-K insulating layer and a photoresist are chemically active when irradiated with a UV beam having a wavelength range between 315 nm and 400 nm. Also, the wavelength of 245 nm activates an O—H group.

FIGS. 3A to 3C illustrate a reaction mechanism of the Low-K insulating layer patterning process of the semiconductor device according to an exemplary embodiment of the present invention. The dehydroxylation of the Low-K insulating layer by irradiating a UW beam is shown. First, as shown in FIG. 3A, a UV beam, having an energy of hv, irradiates the surface of the Low-K insulating layer 52.

The energy of the UV beam is about 4.86 eV, which is larger than the dissociation energy of an O—H bond. The dissociation energy of an O—H bond is 4.43 eV. Accordingly, as shown in FIG. 3B, when the O—H bond is dissociated, the —H group reacts with —OH group. H$_2$O thus evaporates. Also, dissociated —O groups are bonded to —Si, from which —OH group is dissociated. As a result, the surface of the Low-K insulating layer becomes hydrophobic.

When a UV beam is irradiated at an intensity of about 250 mW/cm$^2$ for several milliseconds, it has the same result as a thermal treatment of about 1000° C. for several hours.

A photophysical process of the Low-K insulating layer by UV irradiation will be explained. First, the photophysical process is divided into a photothermal process and a photochemical process. By the photochemical process, the hydroxyl group is removed from the Low-K insulating layer. Also, the density of microscopic defects decreases due to the photothermal process. By removing the hygroscopic property of the Low-K insulating layer, it is possible to improve adhesion between the photoresist and the Low-K insulating layer, thereby improving the reliability of device.

Figure 2B:
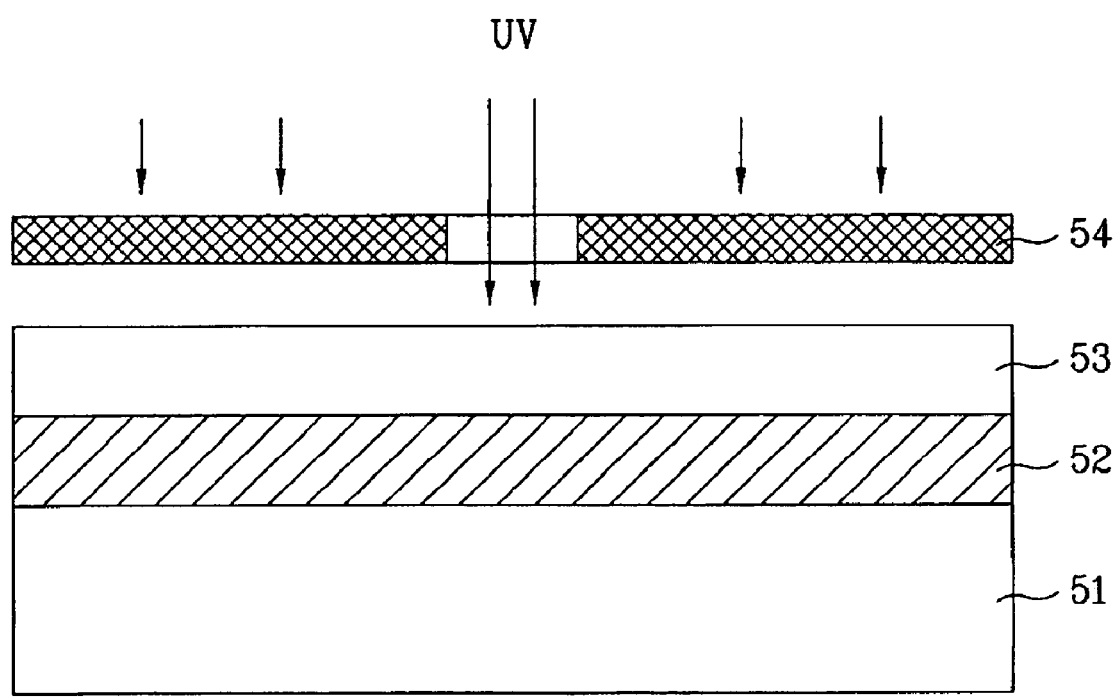

As shown in FIG. 2B, after cleaning the hydrophobic Low-K insulating layer 52, a photoresist 53 is deposited on the Low-K insulating layer 52. Then, after positioning a mask 54 over the photoresist 53, UV rays or X-rays irradiate the photoresist 53. A predetermined pattern of the mask 54 is thereby formed in the photoresist 53.

With the trend towards high integration and high speed in semiconductor devices, a minimum line width of an integrated circuit decreases. Thus, the exposure process has importance. In the exposure process of a semiconductor device, a mercury lamp having a wavelength corresponding to UV radiation is used as a light source. However, the mercury lamp has a disadvantage in that it decreases intensity in the short wavelength. However, when using KrF excimer laser, having a wavelength of 248 nm, or ArF excimer laser, having a wavelength of 193 nm, a circuit line width may decrease even more.

Figure 2C:
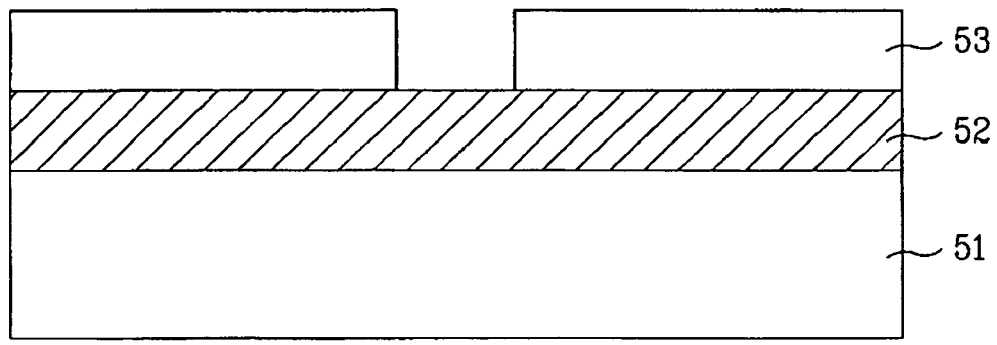

As shown in FIG. 2C, the photoresist 53 is selectively removed by developing the exposed photoresist 53. Next, the photoresist may be exposed to a high temperature, the photoresist may be treated with ion implantation, or the photoresist may be cured by deep UV rays. Thus, the developed portion of the photoresist has a high solution resistance.

If the exposed portion of the photoresist 53 is removed, it is referred to as a positive photoresist. If the unexposed portion of the photoresist 53 is removed, it is referred to as a negative photoresist.

Figure 2D:
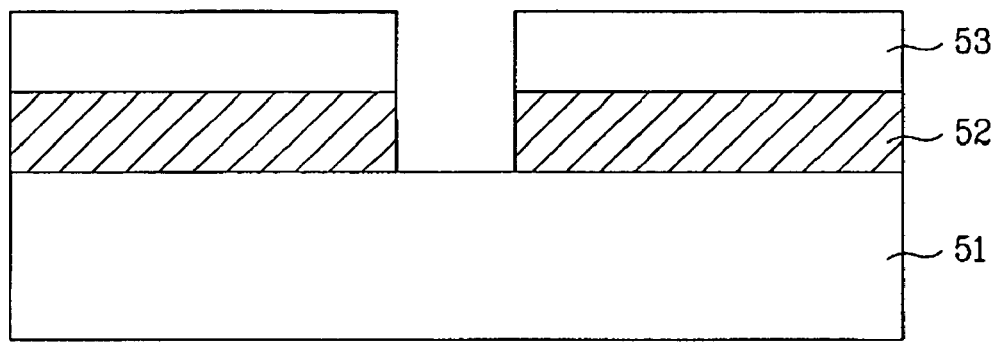

As shown in FIG. 2D, the exposed Low-K insulating layer 52 is etched using the patterned photoresist 53 as a mask. The etching process may be divided into a dry etching process using plasma and a wet etching process using chemical solution.

Figure 2E:
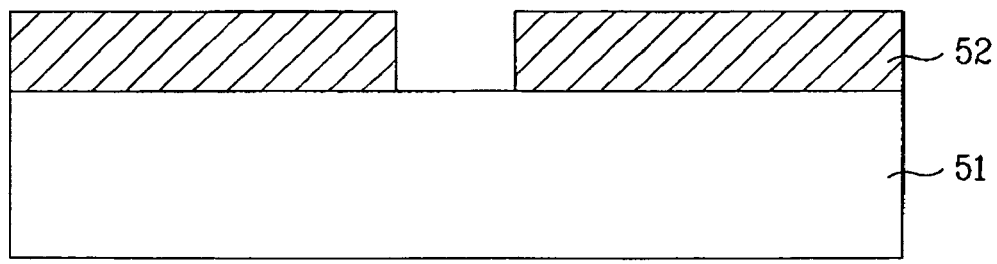

Subsequently, as shown in FIG. 2E, after ashing the photoresist 53 of the semiconductor substrate 51, the Low-K insulating layer 52 is completely patterned. A dry etching process may be used to ash the photoresist. The dry etching process may be divided into a first method of using plasma discharge and a second method of using ozone. The wet etching process may use an organic chemical material including NMP, MEA, BOG, carbitol additive or IPA.

Then a cleaning process is performed to completely remove the photoresist or to remove a residue of drop particles. To remove the residue, a dry cleaning method or a wet cleaning method may be applied. The dry cleaning method may use oxygen plasma. The wet cleaning method may be an organic cleaning, using oxygenated water $H_2O_2$ and hydrofluoric acid HF solution, and/or an inorganic cleaning, using Trichloroethane TCA and acetone.

The method for patterning the Low-K insulating layer of the semiconductor device according to the present invention has the following advantages.

The Low-K insulating layer is irradiated, whereby at least one —OH group having a hydrophilic property is removed from the surface of the Low-K insulating layer. As a result, the surface of the Low-K insulating layer becomes hydrophobic. That is, it is possible to solve the problem of the related art by removing the hygroscopic property of the Low-K insulating layer.

Also, adhesion between the photoresist and the Low-K insulating layer is improved by removing at least one —OH group from the Low-K insulating layer. Accordingly, it is possible to prevent the photoresist from lifting off and to perform uniform exposure, thereby improving the reliability of device.

Furthermore, the density of microscopic defects decreases due to the photothermal process. By removing the hygroscopic property of the Low-K insulating layer, it is possible to improve adhesion between the photoresist and the Low-K insulating layer, thereby improving the reliability of device.

The surface of the Low-K insulating layer becomes hydrophobic by UV irradiation, whereby the dehydroxylation process becomes simple and the process time becomes short.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for patterning a low dielectric (Low-K) insulating layer of a semiconductor device comprising:
    forming a Low-K insulating layer on a semiconductor substrate;
    irradiating the Low-K insulating layer with a beam of light having an energy which corresponds to a dissociation energy of an O—H bond for several milliseconds in order to remove hydroxyl group from a surface of the Low-K insulating layer, to make the Low-K insulating layer hydrophobic and to improve adhesion between the Low-K insulating layer and a photoresist;
    forming a photoresist pattern on the Low-K insulating layer; and
    ashing the photoresist pattern;
    wherein the Low-K insulating layer is formed of any one of a group consisting of phosphorous silicate glass PSG layer, a boron phosphorous silicate glass BPSG layer, an undoped silicate glass USG layer, a fluorine doped silicate glass FSG layer, a high density plasma HDP layer, a plasma enhanced-tetra ethyl ortho silicate PE-TEOS layer, and a spin on glass SOG layer.

2. The method of claim 1, wherein the beam is any one of excimer laser and UV beam.

3. The method of claim 1, wherein the energy is above 4.43 eV.

4. The method of claim 1, wherein the beam is a UV beam.

5. The method of claim 4, wherein the UV beam is irradiated with an intensity of about 250 mW/cm2.

6. The method of claim 1, wherein the beam is a KrF excimer laser.

7. The method of claim 6, wherein the KrF excimer laser is irradiated with an amount within a range of 20 mJ/cm2 to 70 mJ/cm2.

8. The method of claim 1, further comprising:
    cleaning the Low-K insulating layer after irradiating the Low-K insulating layer with a beam to make the Low-K insulating layer hydrophobic.

9. The method of claim 1, wherein irradiating the Low-K insulating layer with a beam to make the Low-K insulating layer hydrophobic includes irradiating the entire Low-K insulating layer.

* * * * *